US011201052B2

(12) United States Patent
Jang et al.

(10) Patent No.: US 11,201,052 B2
(45) Date of Patent: Dec. 14, 2021

(54) COMPOSITION FOR FORMING SILICA LAYER, SILICA LAYER AND ELECTRONIC DEVICE INCORPORATING SILICA LAYER

(71) Applicant: Samsung SDI Co., Ltd., Yongin-si (KR)

(72) Inventors: Seungwoo Jang, Suwon-si (KR); Taeksoo Kwak, Suwon-si (KR); Jin-Hee Bae, Suwon-si (KR); Hyeonsu Jo, Suwon-si (KR); Euihyun Kim, Suwon-si (KR); Kunbae Noh, Suwon-si (KR); Jun Sakong, Suwon-si (KR); Chungheon Lee, Suwon-si (KR); Wanhee Lim, Suwon-si (KR); Byeonggyu Hwang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 16/874,820

(22) Filed: May 15, 2020

(65) Prior Publication Data

US 2020/0365400 A1 Nov. 19, 2020

(30) Foreign Application Priority Data

May 17, 2019 (KR) .................. 10-2019-0057715

(51) Int. Cl.
*H01L 21/02* (2006.01)
*C01B 21/087* (2006.01)
*C01B 33/12* (2006.01)
*H01L 27/108* (2006.01)

(52) U.S. Cl.
CPC ...... *H01L 21/02164* (2013.01); *C01B 21/087* (2013.01); *C01B 33/126* (2013.01); *H01L 21/02282* (2013.01); *H01L 21/02288* (2013.01); *H01L 27/10805* (2013.01)

(58) Field of Classification Search
None
See application file for complete search history.

(56) References Cited

U.S. PATENT DOCUMENTS

2010/0112749 A1* 5/2010 Park ............... H01L 21/02282
438/99
2012/0192761 A1* 8/2012 Hara ..................... H01B 3/02
106/287.11

(Continued)

FOREIGN PATENT DOCUMENTS

CN    102187278 A    9/2011
CN    103502318 A    1/2014

(Continued)

OTHER PUBLICATIONS

Communication dated Sep. 29, 2021, issued by the State Intellectual Property Office of P.R. China in counterpart Chinese Application No. 202010411761.1.

*Primary Examiner* — Erik Kielin
(74) *Attorney, Agent, or Firm* — Sughrue Mion, PLLC

(57) ABSTRACT

Disclosed is a composition for forming a silica layer including perhydropolysilazane (PHPS) and a solvent, wherein in an $^1$H-NMR spectrum of the perhydropolysilazane (PHPS) in $CDCl_3$, when a peak derived from $N_3SiH_1$ and $N_2SiH_2$ is referred to as Peak 1 and a peak derived from $NSiH_3$ is referred to as Peak 2, a ratio $(P_1/(P_1+P_2))$ of an area $(P_1)$ of Peak 1 relative to a total area $(P_1+P_2)$ of the Peak 1 and Peak 2 is greater than or equal to 0.77, and when an area from a minimum point between the peaks of Peak 1 and Peak 2 to 4.78 ppm is referred to as a Region B and an area from 4.78 ppm to a minimum point of Peak 1 is referred to as a Region A of the area of Peak 1, a ratio $(P_A/P_B)$ of an area $(P_A)$ of Region A relative to an area $(P_B)$ of Region B is greater than or equal to about 1.5.

13 Claims, 2 Drawing Sheets

(56) References Cited

U.S. PATENT DOCUMENTS

| | | | | |
|---|---|---|---|---|
| 2014/0106576 A1* | 4/2014 | Morita | ............. | H01L 21/02282 |
| | | | | 438/787 |
| 2016/0333222 A1* | 11/2016 | Lee | ......... | H01B 3/46 |
| 2016/0379817 A1* | 12/2016 | Okamura | ............. | C01B 21/087 |
| | | | | 438/781 |
| 2017/0044401 A1* | 2/2017 | Yamakawa | ......... | B05D 3/0254 |

FOREIGN PATENT DOCUMENTS

| | | |
|---|---|---|
| CN | 105720041 A | 6/2016 |
| CN | 105793963 A | 7/2016 |
| CN | 106147604 A | 11/2016 |
| CN | 107778876 A | 3/2018 |
| JP | 2008-88224 A | 4/2008 |
| JP | 2013-1721 A | 1/2013 |
| JP | 5172867 B2 | 3/2013 |
| JP | 2016-216341 A | 12/2016 |
| KR | 10-2011-0062158 A | 6/2011 |
| KR | 10-1265852 B1 | 5/2013 |
| KR | 10-2014-0127313 A | 11/2014 |
| KR | 10-1599952 B1 | 3/2016 |
| KR | 10-2016-0041728 A | 4/2016 |
| KR | 10-1631356 B1 | 6/2016 |
| KR | 10-1757686 B1 | 7/2017 |
| TW | 201018702 A1 | 5/2010 |
| TW | 201130928 A1 | 9/2011 |
| TW | 201249740 A1 | 12/2012 |
| TW | 201544530 A | 12/2015 |

* cited by examiner

COMPOSITION FOR FORMING SILICA LAYER, SILICA LAYER AND ELECTRONIC DEVICE INCORPORATING SILICA LAYER

CROSS-REFERENCE TO THE RELATED APPLICATION

This application is based on and claims priority to and the benefit of Korean Patent Application No. 10-2019-0057715 filed in the Korean Intellectual Property Office on May 17, 2019, the entire contents of which are incorporated herein by reference.

BACKGROUND OF THE DISCLOSURE

1. Field of the Disclosure

This disclosure relates to a composition for forming a silica layer, a silica layer manufactured using the composition, and an electronic device including the silica layer.

2. Description of Related Art

As semiconductor technology has developed, research on semiconductor memory cells having high integration and a high speed has been made in order to increase integration in a smaller semiconductor chip and improve performance. However, as the integration increases, and a space between wires becomes narrower, a RC delay (resistive-capacitive delay), a cross-talk, deterioration of a response speed and the like may occur and thus, cause a problem in terms of a semiconductor interconnection. In order to solve this problem, appropriate separation among devices may be needed.

The appropriate separation among devices may be performed by widely using a silica layer formed of a silicon-containing material as an interlayer insulating layer of a semiconductor device, a planarization layer, a passivation film, an insulation layer among devices and the like. For example, the silica layer may be used as a protective layer, an insulation layer and the like for a display device and the like as well as the semiconductor device.

For 40 nm or less semiconductor devices, such as a liquid crystal, patterns are being developed with a higher integration density, and thus, a silica layer formed using F-CVD (Flowable Chemical Vapor Deposition) or coating method as an insulation layer filled into a narrow pattern may be used according to the integration density development. In order to provide a silica layer having the insulation characteristics, a coating liquid including, for example, an inorganic polysilazane, may be used as a so-called spin-on dielectric (or SOD). In this case, the thickness (THK) of the silica layer may be deviated depending upon a position of the substrate, which may have unfavorable influences on the following process, which in turn may have an unfavorable effect on the insulation characteristics of the product.

Particularly, when an inorganic polysilazane solution is coated and cured on a pattern wafer by a spin coating method, a common phenomenon is that a thickness of the silica layer will vary depending upon a position of the wafer, a position of the pattern block. When the layer has a non-uniform thickness (THK), it may have unfavorable influences on the following process, such as, for example, chemical mechanical polishing (or CMP).

Therefore, a conventional approach to solving these problems is to increase the molecular weight of the synthesized polysilazane. However, it has been found that increasing the molecular weight of polysilazane may cause problems, such as gelation by contacting moisture.

SUMMARY OF THE DISCLOSURE

In some embodiments, a composition for forming a silica layer is disclosed, the composition being capable of providing a silica layer having excellent uniformity of a thickness (THK) when forming the silica layer.

In some embodiments, a silica layer manufactured using the composition for forming the silica layer is disclosed.

In some embodiments, an electronic device including the silica layer is disclosed.

In some embodiments, a composition for forming a silica layer includes perhydropolysilazane (PHPS) and a solvent, wherein in an $^1$H-NMR spectrum of the perhydropolysilazane (PHPS), when a peak derived from $N_3SiH_1$ and $N_2SiH_2$ is referred to as Peak 1 and a peak derived from $NSiH_3$ is referred to as Peak 2, a ratio ($P_1/(P_1+P_2)$) of an area ($P_1$) of Peak 1 relative to a total area ($P_1+P_2$) of the Peak 1 and Peak 2 is greater than or equal to 0.77, and when an area from a minimum point between the peaks of Peak 1 and Peak 2 to 4.78 ppm is referred to as a Region B and an area from 4.78 ppm to a minimum point of Peak 1 is referred to as a Region A of the area of Peak 1, a ratio ($P_A/P_B$) of an area ($P_A$) of Region A relative to an area ($P_B$) of Region B is greater than or equal to about 1.5.

In some embodiments, the composition for forming the silica layer may have the ratio ($P_1/(P_1+P_2)$) of the area of Peak 1 relative to the total area of Peak 1 and Peak 2 in the $^1$H-NMR spectrum of the perhydropolysilazane (PHPS) of about 0.77 to about 0.82.

In some embodiments, the composition for forming the silica layer may have the ratio ($P_A/P_B$) of the area ($P_A$) of Region A relative to the area ($P_B$) of Region B in the $^1$H-NMR spectrum of the perhydropolysilazane (PHPS) of about 1.5 to about 2.0.

In some embodiments, the perhydropolysilazane (PHPS) may have a weight average molecular weight of about 3,000 g/mol to about 30,000 g/mol.

In some embodiments, the perhydropolysilazane (PHPS) may have a weight average molecular weight of about 5,000 g/mol to about 15,000 g/mol.

In some embodiments, the perhydropolysilazane (PHPS) may be included in an amount of about 0.1 wt % to about 30 wt % based on a total amount of the composition for forming the silica layer.

In some embodiments, the solvent may include benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, p-menthane, dipropylether, dibutylether, anisole, butyl acetate, amyl acetate, methylisobutylketone, or a combination thereof.

In some embodiments, the disclosure provides a silica layer manufactured from the composition for forming the silica layer.

In some embodiments, the disclosure provides an electronic device including the silica layer.

In some embodiments, the composition for forming the silica layer may provide a silica layer having excellent uniformity of the thickness THK of the layer when forming the silica layer.

In some embodiments, the silica layer may have excellent thickness (THK) uniformity, thereby increasing the semiconductor yield of an electronic device including the same.

Additional features and advantages of the present disclosure are described further below. This summary section is meant merely to illustrate certain features of the disclosure, and is not meant to limit the scope of the disclosure in any way. The failure to discuss a specific feature or embodiment of the disclosure, or the inclusion of one or more features in this summary section, should not be construed to limit the claims.

BRIEF DESCRIPTION OF THE DRAWINGS

The foregoing summary, as well as the following detailed description of certain embodiments of the application, will be better understood when read in conjunction with the appended drawings. It should be understood, however, that the disclosure is not limited to the precise arrangements and instrumentalities shown. In the drawings.

DETAILED DESCRIPTION OF THE EMBODIMENTS

Figure 1:
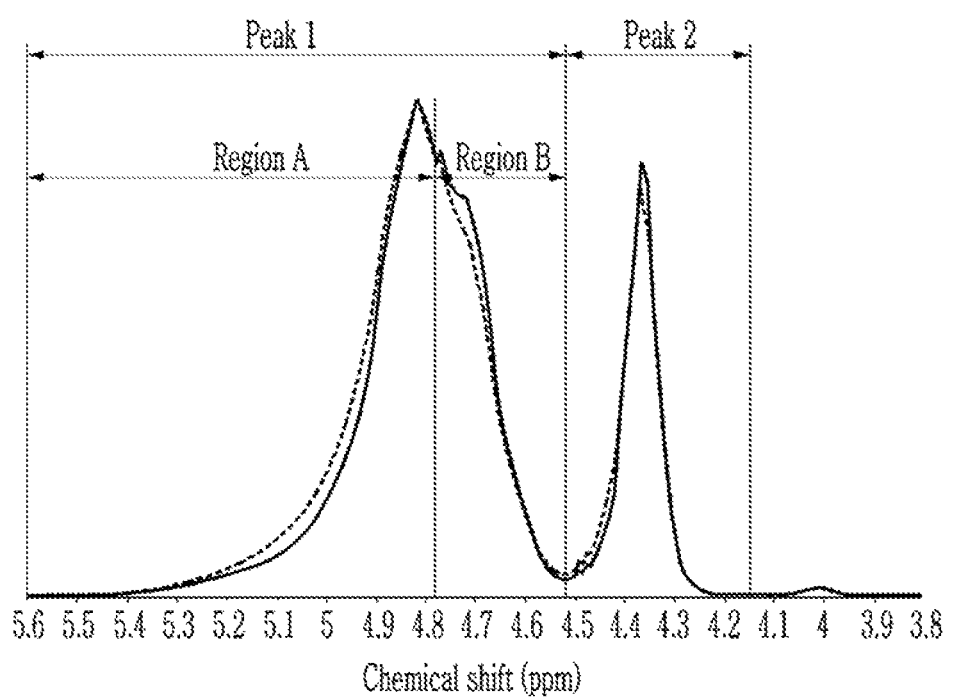
FIG. 1 shows the intervals of Peak 1, Peak 2, Region A, and Region B in a $^1$H-NMR spectrum of perhydropolysilazane (PHPS).

Hereinafter, embodiments of the present disclosure are described in more detail. However, it is to be understood that the disclosure is not limited to particular compositions, methods, and experimental conditions described, as such compositions, methods, and conditions may vary. These embodiments are exemplary, and the present disclosure is not limited thereto, since the present invention is defined by the scope of the appended claims.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used in this specification and the appended claims, the singular forms "a", "an", and "the" include plural references unless the context clearly dictates otherwise. Thus, for example, references to "a solvent" may include one or more different solvents, Unless defined otherwise, all technical and scientific terms used herein have the same meaning as commonly understood by one of ordinary skill in the art to which this disclosure belongs. Any methods and materials similar or equivalent to those described herein may be used in the practice or testing of the disclosure, as it will be understood that modifications and variations are encompassed within the spirit and scope of the instant disclosure.

Unless otherwise stated, each range disclosed herein will be understood to encompass and be a disclosure of each discrete point and all possible subranges within the range.

As used herein, "about," "approximately," "substantially," and "significantly" will be understood by a person of ordinary skill in the art and will vary in some extent depending on the context in which they are used. If there are uses of the term which are not clear to persons of ordinary skill in the art given the context in which it is used, "about" and "approximately" will mean plus or minus <10% of particular term, and "substantially" and "significantly" will mean plus or minus >10% of the particular term. "Comprising" and "consisting essentially of" have their customary meaning in the art.

Hereinafter, a composition for forming a silica layer according to an embodiment is described.

According to an embodiment, a composition for forming a silica layer includes perhydropolysilazane (PHPS) and a solvent, wherein in a $^1$H-NMIR spectrum of the perhydropolysilazane (PHPS) in $CDCl_3$, when a peak derived from $N_3SiH_1$ and $N_2SiH_2$ is referred to as Peak 1 and a peak derived from $NSiH_3$ is referred to as Peak 2, a ratio ($P_1/(P_1+P_2)$) of an area ($P_1$) of Peak 1 relative to a total area ($P_1+P_2$) of the Peak 1 and Peak 2 is greater than or equal to 0.77, and when an area from a minimum point between the peaks of Peak 1 and Peak 2 to 4.78 ppm is referred to as a Region B and an area from 4.78 ppm to a minimum point of Peak 1 is referred to as a Region A of the area of Peak 1, and a ratio ($P_A/P_B$) of an area ($P_A$) of Region A relative to an area ($P_B$) of Region B is greater than or equal to about 1.5.

Polysilazane refers to a polymer in which silicon atoms and nitrogen atoms in the polymer are continuously and alternately bonded (silazane bonded) to each other to form a basic backbone, and perhydropolysilazane (PHPS) refers to a polymer where all of the elements substituted at the silicon atom and the nitrogen atom of the polysilazane are hydrogen (H).

When perhydropolysilazane (PHPS) is analyzed by a $^1$H-NMR spectrum, three types of Si—H functional groups derived from units represented by $N_3Si$—H, $N_2Si$—$H_2$, and $NSi$—$H_3$ in perhydropolysilazane (PHPS) may be confirmed (referring to FIG. 1).

In this case, in the $^1$H-NMR spectrum of perhydropolysilazane (PHPS), an area of each peak is proportional to the number of hydrogen (H) included in the corresponding functional group, so the peak area increases as the number of the corresponding functional groups increases. Accordingly, it means that the $N_3SiH_1$ functional group and the $N_2SiH_2$ functional group are present more than the $NSiH_3$ functional group in the perhydropolysilazane (PHPS) as the area ratio of $P_1/(P_1+P_2)$ is getting higher.

Meanwhile, $^1$H-NMIR spectrum of perhydropolysilazane (PHPS) having a weight average molecular weight of about 3,000 g/mol to about 30,000 g/mol shows a broad peak, wherein the peak derived from $N_3Si$—H and $N_2Si$—$H_2$ (e.g., Peak 1 shown in FIG. 1) and the peak derived from $NSi$—$H_3$ (e.g., Peak 2 shown in FIG. 1) are made in different ppm ranges, so it is observed in two distinct peaks in the $^1$H-NMR spectrum. However, the individual peaks derived from $N_3Si$—H and $N_2Si$—$H_2$ are made in similar ppm ranges to each other, so it is shown in a shape that two peaks are considerably overlapped in the $^1$H-NMR spectrum.

As noted above, perhydropolysilazane (PHPS) shows a shape in which the peaks derived from $N_3Si$—H and $N_2Si$—$H_2$ are considerably overlapped in the $^1$H-NMR spectrum, so conventionally, only the characteristics of Peak 1 and Peak 2 or the area ratio are considered when defining or analyzing perhydropolysilazane (PHPS). However, it is insufficient to define a structure or characteristics of perhydropolysilazane (PHPS) in this manner.

In a semiconductor device, a silica layer formed on an insulation layer by F-CVD (Flowable Chemical Vapor Deposition) or a coating method may be used for developing a pattern having high integration density. In order to provide a silica layer having insulation characteristics, an inorganic polysilazane-included coating liquid may be used as a SOD (Spin-On Dielectric). In this case, a thickness of the silica layer may be deviated depending upon the position of the substrate, which may result in unfavorable influences on the insulation characteristics of the electronic device including the silica layer. In order to solve these problems, a conventional approach has been to increase the molecular weight of the polysilazane included in the composition for forming the silica layer, but this has been found to cause problems of gelation when contacting the same with moisture as the molecular weight of polysilazane increases.

The present inventors discovered that the thickness uniformity of the silica layer obtained from the composition for forming a silica layer including the perhydropolysilazane (PHPS) and a solvent is significantly improved when $P_A/P_B$, an area ratio of Region A to Region B, as well as $P_1/(P_1+P_2)$, an area ratio of between Peak 1 and Peak 2, are simultaneously within the predetermined ranges.

In other words, when the composition for forming a silica layer according to an embodiment includes a solvent and perhydropolysilazane (PHPS) having a $P_1/(P_1+P_2)$ ratio of greater than or equal to about 0.77 and a $P_A/P_B$ ratio of greater than or equal to about 1.5, and when a silica layer is coated on a wafer using the composition, the thickness uniformity of the silica layer may be significantly improved.

When a cured layer is prepared by including a solvent and perhydropolysilazane (PHPS) having $P_1/(P_1+P_2)$, an area ratio of peaks, of greater than or equal to about 0.77, wherein Peak 1 is derived from $N_3SiH_1$ and $N_2SiH_2$, and Peak 2 is derived from $NSiH_3$, and $P_A/P_B$, an area ratio of Region A to Region B, of greater than or equal to about 1.5, wherein Region B (e.g., Region B in FIG. 1) refers to a region from a minimum point between the peaks of Peak 1 and Peak 2 to about 4.78 ppm in Peak 1, and Region A (e.g., Region A in FIG. 1) refers to a region from about 4.78 ppm to the minimum point of Peak 1, it may provide a silica layer having excellent film thickness uniformity.

Both conditions of the area ratio of $P_1/(P_1+P_2)$ of greater than or equal to about 0.77 and the area ratio of $P_A/P_B$ of greater than or equal to about 1.5 in the $^1$H-NMR spectrum of perhydropolysilazane (PHPS) may be simultaneously satisfied, but when either of them is not satisfied, it can be difficult to provide a silica layer having excellent thickness (THK) uniformity according to an embodiment.

Meanwhile, during coating and curing the perhydropolysilazane (PHPS) solution on the pattern wafer, the thickness of the layer may be varied depending upon the position of the wafer and the position of the pattern block, and the like. Particularly, when the composition for forming a silica layer is coated and cured on the wafer, the thickness of the silica layer coated on the wafer is generally decreases as going to the edge of the pattern block from the center of the pattern block. This generates a difference in thickness of the silica layer between the center of the pattern block and the edge, so as to decrease the thickness uniformity of the whole layer.

Figure 2:
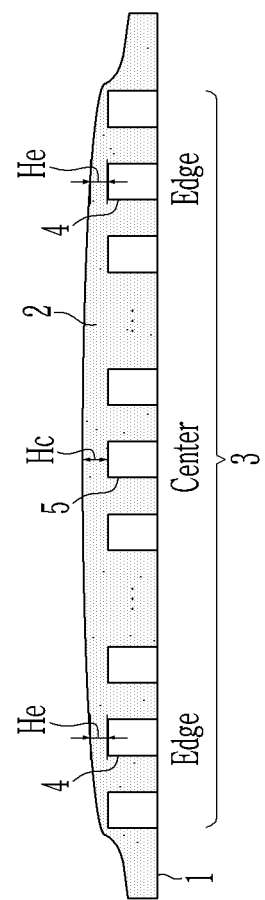
FIG. 2 is a schematic cross-sectional view of some pattern blocks by forming a silica layer on a patterned wafer and then cutting along the diameter of the wafer.

FIG. 2 is a schematic cross-sectional view showing a part of pattern block 3 in a wafer in which a silica layer 2 is formed by coating the perhydropolysilazane solution on the patterned wafer 1 according to an embodiment, and then cut along with a diameter of the wafer. Referring to FIG. 2, He is lower than Hc, wherein He refers to a thickness of the silica layer coated on the edge of the pattern block 3 (more specifically, on the upper end of the second pattern line 4 from the edge of the pattern block), and Hc refers to a thickness of the silica layer coated on the upper end of the pattern line 5 formed on the center of the pattern block. In other words, the thickness uniformity of the silica layer may improves as He and Hc become more similar to each other. Therefore, as the He/Hc ratio approaches about 1, the thickness uniformity of the silica layer may be getting better.

Therefore, when the area ratio of $P_1/(P_1+P_2)$ is greater than or equal to about 0.77, and simultaneously, the area ratio of $P_A/P_B$ is greater than or equal to about 1.5 in $^1$H-NMR spectrum of perhydropolysilazane (PHPS) as in an embodiment, the He/Hc ratio of the silica layer formed by the composition for forming a silica layer including perhydropolysilazane (PHPS) is near to about 1, meaning that the corresponding silica layer has an excellent thickness uniformity.

In an example embodiment, the $P_1/(P_1+P_2)$ ratio may be about 0.77 to about 0.82, for example, about 0.775 to about 0.82, about 0.78 to about 0.82, about 0.785 to about 0.82, about 0.79 to about 0.82, about 0.795 to about 0.82, about 0.80 to about 0.82, about 0.77 to about 0.815, about 0.77 to about 0.81, about 0.77 to about 0.805, or about 0.77 to about 0.80, but is not limited thereto. When the $P_1/(P_1+P_2)$ ratio satisfies the range, the silica layer obtained from the corresponding composition for forming a silica layer may have excellent film thickness (THK) uniformity characteristics.

In an example embodiment, the $P_A/P_B$ ratio may be about 1.5 to about 2.0, for example, about 1.6 to about 2.0, about 1.7 to about 2.0, about 1.8 to about 2.0, about 1.9 to about 2.0, about 1.5 to about 1.9, about 1.5 to about 1.8, about 1.5 to about 1.7, about 1.5 to about 1.6, about 1.6 to about 1.9, about 1.7 to about 1.9, or about 1.5 to about 1.8, but is not limited thereto. When the $P_A/P_B$ ratio satisfies the range, the silica layer obtained from the composition for forming a silica layer may have excellent film thickness (THK) uniformity characteristics.

Meanwhile, the $^1$H-NMR spectrum of perhydrosilazane may be measured by dissolving the synthesized perhydropolysilazane (PHPS) into a solvent in an appropriate concentration; removing the solvent using a rotary evaporator; and adding a solvent for measuring $^1$H-NMR spectrum, for example, $CDCl_3$ (chloroform-d) thereto to provide a solution for measuring $^1$H-NMR spectrum. The method of measuring $^1$H-NMR spectrum is well known for a person having ordinary skills in the art.

The weight average molecular weight of perhydropolysilazane (PHPS) may be about 3,000 g/mol to about 30,000 g/mol, for example, about 4,000 g/mol to about 30,000 g/mol, about 5,000 g/mol to about 30,000 g/mol, about 5,000 g/mol to about 25,000 g/mol, about 5,000 g/mol to about 20,000 g/mol, about 5,000 g/mol to about 15,000 g/mol, about 5,000 g/mol to about 10,000 g/mol, about 6,000 g/mol to about 30,000 g/mol, about 7,000 g/mol to about 30,000 g/mol, about 8,000 g/mol to about 30,000 g/mol, about 9,000 g/mol to about 30,000 g/mol, about 10,000 g/mol to about 30,000 g/mol, about 10,000 g/mol to about 25,000 g/mol, about 10,000 g/mol to about 20,000 g/mol, or about 10,000 g/mol to about 15,000 g/mol, but is not limited thereto. When the weight average molecular weight of perhydropolysilazane (PHPS) satisfies the range, the silica layer formed from the composition for forming a silica layer may have excellent characteristics of a film thickness (THK) uniformity.

The perhydropolysilazane (PHPS) may be included in a concentration of about 0.1 to about 30 wt %, for example, about 0.5 to about 30 wt %, about 1.0 to about 30 wt %, about 1 to about 25 wt %, about 3 to about 25 wt %, about 5 to about 25 wt %, about 10 to about 25 wt %, about 15 to about 25 wt %, about 1 to about 20 wt %, about 3 to about 20 wt %, about 5 to about 20 wt %, about 10 to about 20 wt %, or about 20 wt % based on a total amount of the composition for forming a silica layer, but is not limited thereto.

The solvent included in the composition for forming the silica layer is not particularly limited as long as it may dissolve the perhydropolysilazane (PHPS) and does not react with the perhydropolysilazane. It may include, for example, benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, p-menthane, dipropylether, dibutylether, anisole, butyl acetate, amyl acetate, methylisobutylketone, or a combination thereof, but is not limited thereto.

The composition for forming a silica layer according to an embodiment may further include a thermal acid generator (TAG).

The thermal acid generator may be an additive to improve a property of developing the composition for forming a silica layer, and thus makes organosilane-based condensation polymers of the composition be developed at a relatively low temperature.

The thermal acid generator may include any compound without particular limit, if it generates acid ($H^+$) by heat. In particular, it may include a compound activated at 90° C. or higher and generating sufficient acid and also, having low volatility.

The thermal acid generator may be, for example, selected from nitrobenzyl tosylate, nitrobenzyl benzenesulfonate, phenol sulfonate, or a combination thereof.

The thermal acid generator may be included in an amount of about 0.01 wt % to about 25 wt % based on a total amount of the composition for forming a silica layer. Within the range, the condensation polymer may be developed at a low temperature and simultaneously have improved coating properties.

The composition for forming a silica layer may further include a surfactant.

The surfactant is not particularly limited and may be, for example, a non-ionic surfactant of polyoxyethylene alkyl ethers such as, polyoxyethylene lauryl ether, polyoxyethylene stearyl ether, polyoxyethylene cetyl ether, polyoxyethylene oleyl ether, and the like, polyoxyethylene alkylallyl ethers, such as polyoxyethylenenonyl phenol ether, and the like, a polyoxyethylene.polyoxypropylene block copolymer, polyoxyethylene sorbitan fatty acid ester such as sorbitan monolaurate, sorbitan monopalmitate, sorbitan monostearate, sorbitan monoleate, polyoxyethylene sorbitan monostearate, polyoxyethylene sorbitan trioleate, polyoxyethylene sorbitan tristearate, and the like; a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and the like; other silicone-based surfactants such as an organosiloxane polymer KP341 (Shin-Etsu Chemical Co., Ltd.), and the like.

The surfactant may be included in an amount of about 0.001 wt % to about 10 wt % based on a total amount of the composition for forming a silica layer. Within the range, dispersion of a solution and simultaneously, uniform thickness of a layer may be improved.

Another embodiment of the present disclosure provides a silica layer prepared from the composition for forming a silica layer.

The silica layer may be formed by coating the composition for forming a silica layer including a solvent and perhydropolysilazane, according to an embodiment on a substrate and curing the same. Specifically, the silica layer may be manufactured by using a method for manufacturing a silica layer that includes coating the composition for forming a silica layer on a substrate; drying the substrate coated with the composition for forming a silica layer; and curing the same under an inert gas atmosphere of greater than or equal to about 150° C.

For example, the composition for forming a silica layer may be coated using a solution process such as a spin-on coating method, slit coating, inkjet printing, and the like.

The substrate may be, for example, a device substrate such as a semiconductor, a liquid crystal and the like, but is not limited thereto.

The obtained silica layer may also provide a cross-sectional view of the silica layer coated on a wafer using an equipment such as SEM (manufactured by Hitachi, SU-8230).

The silica layer according to an embodiment has excellent layer thickness (THK) uniformity, so it may be effectively employed for usages such as, for example, a protective layer such as an insulation layer, a charge film, and a hard coating, a semiconductor capacitor, and the like. The insulation layer may be used, for example, between a transistor device and a bit line, between a transistor device and a capacitor, and the like, but is not limited thereto. Another embodiment of the present disclosure provides an electronic device including the silica layer. The electronic device may include a display device, a semiconductor, an image sensor, and the like.

Hereinafter, the present disclosure is illustrated in more detail with reference to examples. However, these examples are exemplary, and the present disclosure is not limited thereto.

EXAMPLES

Synthesis Example 1

Preparation of Perhydropolysilazane (PHPS) Semi-Finished Product (A)

The inside of a 2 L reactor with a stirrer and a temperature controller was substituted with dry nitrogen. 1,500 g of dry pyridine was added into the reactor and cooled at 5° C. Subsequently, 100 g of dichlorosilane was slowly added thereto for one hour. Then, 70 g of ammonia was slowly added into the reactor for 3 hours. After completing the ammonia addition, dry nitrogen was added for 30 minutes, and ammonia remaining in the reactor was removed. The obtained white slurry product was filtered using a 1 μm Teflon filter under a dry nitrogen atmosphere to provide 1,000 g of filterate. After adding 1000 g of dry xylene, a solvent of pyridine was substituted with xylene using a rotary evaporator, which was repeated for 3 times, so that a solid content was 80%, and it was filtered using a Teflon filter having a pore size of 0.1 μm. A perhydropolysilazane (PHPS) semi-finished product (A) having a solid content of 80% and a weight average molecular weight of 3,000 g/mol was obtained.

Preparation of Perhydropolysilazane (PHPS)

Example 1

40 g of the perhydropolysilazane (PHPS) semi-finished product (A) obtained from Synthesis Example 1, 365 g of dry pyridine, and 75 g of dry xylene were added into a 1L reactor with a stirrer and a temperature controller and heated at 100° C. and stirred until reaching a weight average molecular weight shown in Table 1. After completing the reaction, a process of substituting the solvent with dibutylether was repeated at 50° C. for 4 times, and then it was filtered by a 0.1 μm Teflon filter by adjusting the solid concentration at 20% to provide perhydropolysilazane (PHPS) having a weight average molecular weight of 9,292 g/mol.

Examples 2 to 5 and Comparative Examples 1 to 5

40 g of the perhydropolysilazane (PHPS) semi-finished product (A) obtained in Synthesis Example 1 was added into a 1L reactor with a stirrer and a temperature controller and added with dry pyridine and dry xylene in the contents shown in Table 1, and heated at 100° C. and then stirred until reaching each of them to a weight average molecular weight shown in Table 1. After completing the reaction, a process of substituting the solvent with dibutylether was repeated at 50° C. for 4 times, and the solid concentration was adjusted at 20% and filtered by a 0.1 μm Teflon filter, so as to provide perhydropolysilazane (PHPS) according to Examples 2 to 5 and Comparative Example 1 to 5 having the weight average molecular weights (Mw) shown in Table 1, respectively. The weight average molecular weight (Mw) is a polystyrene conversion value by GPC (Gel Permation Chromatography) measurement.

TABLE 1

|  | Inorganic polysilazane semi-finished Product (A) (g) | Dry pyridine (g) | Dry xylene (g) | Mw (g/mol) |
|---|---|---|---|---|
| Example 1 | 40 | 365 | 75 | 9,292 |
| Example 2 | 40 | 410 | 30 | 9,256 |
| Example 3 | 40 | 184 | 16 | 9,278 |
| Example 4 | 40 | 237 | 43 | 9,271 |
| Example 5 | 40 | 237 | 43 | 7,119 |
| Comparative Example 1 | 40 | 151 | 49 | 8,367 |
| Comparative Example 2 | 40 | 102 | 18 | 12,689 |
| Comparative Example 3 | 40 | 102 | 18 | 9,649 |
| Comparative Example 4 | 40 | 151 | 49 | 5,819 |
| Comparative Example 5 | 40 | 77 | 3 | 10,003 |

Evaluation 1: Area Measurement of Peak 1, Peak 2 and Region A, Region B in the $^1$H-NMR Spectrum of Perhydropolysilazane (PHPS)

0.1 g of the perhydropolysilazane (PHPS) solutions (solid concentration 20%) obtained from Examples 1 to 5 and Comparative Examples 1 to 5 was added into a vial, and the solvent was removed using a rotary evaporator. The dried solution was mixed with 2.0 g of a $CDCl_3$ (chloroform-d) solvent to provide a solution for measuring the $^1$H-NMR spectrum. The solution was measured for the $^1$H-NMR spectrum at 300 MHz.

In $^1$H-NMR spectrum, each area of Peak 1 derived from $N_3SiH_1$ and $N_2SiH_2$ and Peak 2 derived from $NSiH_3$ was measured, and each area of Region B of between the minimum point between the peaks of Peak 1 with Peak 2 to 4.78 ppm in the region of Peak 1 and Region A of between 4.78 ppm and the minimum point of Peak 1 was measured.

As noted above, $P_1/(P_1+P_2)$ refers to an area ratio of Peak 1 with respect to the total area of Peak 1 and Peak 2, and $P_A/P_B$ refers to a ratio of a Region A to a Region B.

The measured NMR integrals of Peak 1, Peak 2, Region A, and Region B, $P_1/(P_1+P_2)$, and $P_A/P_B$ are shown in Table 2.

Evaluation 2: Preparation of Silica Layer and He/Hc Measurement

The perhydropolysilazane (PHPS) solutions obtained from Examples 1 to 5 and Comparative Examples 1 to 5 were each coated on a 8-inch wafer (Pattern wafer) formed with a pattern having a line width of 0.7 μm, a space width of 0.7 μm, and a height of 1.0 μm by a spin coater. After prebaking the same at 150° C. for 2 minutes, it was heated at 1,000° C. under an oxygen ($O_2$) atmosphere and cured at a corresponding temperature for 1 hour under a $H_2/O_2$ atmosphere, so as to provide a silica layer formed with each composition according to Examples 1 to 5 and Comparative Examples 1 to 5.

The pattern wafer coated with the silica layer was diced along with a diameter, and then a thickness He of the silica layer at the upper end of the second pattern line from the edge of the pattern block and a thickness Hc of the silica layer at the upper end of the pattern line of the center of the pattern block were measured. The He/Hc ratios, obtained by dividing He by Hc, are shown in Table 2.

TABLE 2

|  | NMR integral value | | | | | | |
|---|---|---|---|---|---|---|---|
|  | Region A | Region B | Peak 1 | Peak 2 | $P_1/(P_1 + P_2)$ | $P_A/P_B$ | He/Hc |
| Example 1 | 52.0 | 27.2 | 79.2 | 20.8 | 0.792 | 1.92 | 0.69 |
| Example 2 | 52.1 | 28.0 | 80.1 | 19.9 | 0.801 | 1.86 | 0.62 |
| Example 3 | 48.8 | 30.0 | 78.7 | 21.3 | 0.787 | 1.63 | 0.49 |
| Example 4 | 50.0 | 28.7 | 78.6 | 21.4 | 0.786 | 1.74 | 0.44 |
| Example 5 | 48.8 | 30.0 | 78.8 | 21.2 | 0.788 | 1.62 | 0.44 |
| Comparative Example 1 | 47.0 | 29.6 | 76.6 | 23.4 | 0.766 | 1.59 | 0.29 |
| Comparative Example 2 | 46.1 | 32.0 | 78.1 | 21.9 | 0.781 | 1.44 | 0.29 |
| Comparative Example 3 | 45.5 | 32.8 | 78.3 | 21.7 | 0.783 | 1.39 | 0.26 |
| Comparative Example 4 | 46.2 | 32.3 | 78.5 | 21.5 | 0.785 | 1.43 | 0.21 |
| Comparative Example 5 | 44.3 | 34.1 | 78.4 | 21.6 | 0.784 | 1.30 | 0.16 |

Referring to Table 2, in Examples 1 to 5 in which $P_1/(P_1+P_2)$, which is an area ratio of Peak 1 with respect to the total area of Peak 1 and Peak 2, was greater than or equal to 0.77, and $P_A/P_B$, which was an area ratio of Region A to Region B, was greater than or equal to 1.5, the ratios He/Hc were each greater than or equal to at least 0.44.

On the contrary, in Comparative Example 1 in which $P_1/(P_1+P_2)$ was less than 0.77, and $P_A/P_B$ was greater than or equal to 1.5, the He/Hc ratio was 0.29. Accordingly, it was confirmed that the thickness uniformity of the silica layer of Comparative Example 1 was inferior to the silica layers according to Examples 1 to 5.

In addition, in Comparative Examples 2 to 5 having $P_1/(P_1+P_2)$ of greater than or equal to 0.77 but having $P_A/P_B$ of less than 1.5, all of the He/Hc ratios were less than or equal to 0.29. Accordingly, it was confirmed that the thickness uniformity of the silica layers of Comparative Examples 2 to 5 was not satisfactory compared with Examples 1 to 5.

Resultantly, when $P_1/(P_1+P_2)$ was greater than or equal to 0.77, and simultaneously $P_A/P_B$ was greater than or equal to 1.5, the He/Hc ratio was shown to be approaching closer to 1. From these results, the silica layers had small thickness differences between the center and edge of the pattern blocks, that is, the silica layers were each shown to have excellent thickness uniformity as a whole.

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims. Therefore, the aforementioned embodiments should be understood to be exemplary but not limiting the present disclosure in any way.

What is claimed is:

1. A composition for forming a silica layer, the composition comprising perhydropolysilazane (PHPS) and a solvent,
   wherein in a $^1$H-NMR spectrum of the perhydropolysilazane (PHPS) in $CDCl_3$, when a peak derived from $N_3SiH_1$ and $N_2SiH_2$ is referred to as Peak 1 and a peak derived from $NSiH_3$ is referred to as Peak 2, a ratio $(P_1/(P_1+P_2))$ of an area $(P_1)$ of Peak 1 relative to a total area $(P_1+P_2)$ of Peak 1 and Peak 2 is greater than or equal to 0.77, and when an area from a minimum point between the peaks of Peak 1 and Peak 2 to 4.78 ppm is referred to as a Region B of the area $(P_1)$ of Peak 1 and an area from 4.78 ppm to a minimum point of Peak 1 is referred to as a Region A of the area $(P_1)$ of Peak 1, a ratio $(P_A/P_B)$ of an area $(P_A)$ of Region A relative to an area $(P_B)$ of Region B is greater than or equal to 1.5.

2. The composition of claim 1, wherein the ratio $(P_1/(P_1+P_2))$ of the area of Peak 1 relative to the total area of Peak 1 and Peak 2 in the $^1$H-NMR spectrum of the perhydropolysilazane (PHPS) is 0.77 to 0.82.

3. The composition of claim 1, wherein the ratio $(P_A/P_B)$ of the area $(P_A)$ of Region A relative to the area $(P_B)$ of Region B is 1.5 to 2.0.

4. The composition of claim 1, wherein the perhydropolysilazane (PHPS) has a weight average molecular weight of 3,000 g/mol to 30,000 g/mol.

5. The composition of claim 1, wherein the perhydropolysilazane (PHPS) has a weight average molecular weight of 5,000 g/mol to 15,000 g/mol.

6. The composition of claim 1, wherein the perhydropolysilazane (PHPS) is included in an amount of 0.1 wt % to 30 wt % based on a total amount of the composition for forming the silica layer.

7. The composition of claim 1, wherein the solvent comprises benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, p-menthane, dipropylether, dibutylether, anisole, butyl acetate, amyl acetate, methylisobutylketone, or a combination thereof.

8. A silica layer manufactured from the composition for forming the silica layer of claim 1.

9. An electronic device comprising the silica layer of claim 8.

10. A method of manufacturing a silica layer, the method comprising a step of coating the composition for forming the silica layer of claim 1 on a substrate.

11. The method of claim 10, wherein the step of coating comprises spin-on coating the composition, slit coating the composition, or inkjet printing the composition.

12. A method of manufacturing an electronic device, the method comprising forming a silica layer between a transistor device and a bit line or between a transistor device and a capacitor, the silica layer formed by a step of coating the composition for forming the silica layer of claim 1.

13. The method of claim 12, wherein the step of coating comprises spin-on coating the composition, slit coating the composition, or inkjet printing the composition.

* * * * *